United States Patent
Lee

(10) Patent No.: US 9,184,219 B2
(45) Date of Patent: Nov. 10, 2015

(54) METHOD OF MANUFACTURING AN ORGANIC LIGHT-EMITTING DISPLAY DEVICE

(71) Applicant: Samsung Display Co., Ltd., Yongin, Gyeonggi-Do (KR)

(72) Inventor: June-Woo Lee, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/187,993

(22) Filed: Feb. 24, 2014

(65) Prior Publication Data

US 2014/0179051 A1    Jun. 26, 2014

Related U.S. Application Data

(62) Division of application No. 13/210,532, filed on Aug. 16, 2011, now Pat. No. 8,692,254.

(30) Foreign Application Priority Data

Dec. 8, 2010   (KR) .................. 10-2010-0124861

(51) Int. Cl.
   *H01L 51/00*    (2006.01)
   *H01L 27/32*    (2006.01)
   *H01L 51/56*    (2006.01)

(52) U.S. Cl.
   CPC ........ *H01L 27/3244* (2013.01); *H01L 27/3265* (2013.01); *H01L 51/0023* (2013.01); *H01L 51/56* (2013.01); *H01L 27/3262* (2013.01)

(58) Field of Classification Search
   None
   See application file for complete search history.

(56) References Cited

U.S. PATENT DOCUMENTS

| 7,256,060 | B2 | 8/2007 | Park |
| 7,532,263 | B2 | 5/2009 | Lee et al. |
| 7,683,977 | B2 | 3/2010 | Nagata et al. |
| 7,995,171 | B2 | 8/2011 | Kim et al. |
| 8,354,669 | B2 | 1/2013 | No et al. |
| 2003/0137255 | A1 | 7/2003 | Park et al. |
| 2005/0017247 | A1 | 1/2005 | Koo et al. |
| 2005/0062039 | A1 | 3/2005 | Kim |
| 2006/0027812 | A1 | 2/2006 | Yang |
| 2007/0090362 | A1 | 4/2007 | Ahn et al. |
| 2008/0111484 | A1 | 5/2008 | Kwon et al. |
| 2008/0265254 | A1 | 10/2008 | Nishiura |
| 2009/0302332 | A1 | 12/2009 | Kang et al. |

FOREIGN PATENT DOCUMENTS

| CN | 1547067 A | 11/2004 |
| KR | 2003-0057018 | 7/2003 |
| KR | 10-0787461 | 12/2007 |
| KR | 10-2009-0127715 | 12/2009 |

OTHER PUBLICATIONS

Chinese Office Action issued by Chinese Patent Office on Apr. 29, 2015 in connection with corresponding CN201110399563.9 and Request for Entry of the Accompanying Office Action attached herewith.

*Primary Examiner* — Benjamin Sandvik
(74) *Attorney, Agent, or Firm* — Robert E. Bushnell, Esq.

(57) ABSTRACT

A method of forming an organic light-emitting display in which a pixel electrode is formed by extending from source and drain electrodes, a capacitor including a thin upper capacitor electrode formed below the pixel electrode and constituting a metal-insulator-metal (MIM) CAP structure, thereby simplifying manufacturing processes, increasing an aperture ratio, and improving a voltage design margin.

7 Claims, 4 Drawing Sheets

US 9,184,219 B2

METHOD OF MANUFACTURING AN ORGANIC LIGHT-EMITTING DISPLAY DEVICE

CLAIM OF PRIORITY

This application makes reference to, incorporates the same herein, and claims all benefits accruing under 35 U.S.C §119 from an application earlier filed in the Korean Intellectual Property Office on 8 Dec. 2010, and there duly assigned Ser. No. 10-2010-0124861 by that Office. Furthermore, this application is filed pursuant to 35 U.S.C. §121 as a Divisional application of Applicants' patent application Ser. No. 13/210,532 filed in the U.S. Patent & Trademark Office on 16 Aug. 2011, and assigned to the assignee of the present invention. All benefits accruing under 35 U.S.C. §120 from the aforesaid present application Ser. No. 13/210,532 are also claimed.

BACKGROUND OF THE INVENTION

1. Field of the Invention

One or more aspects of the present invention relate to a methods of manufacturing an organic light-emitting display device.

2. Description of the Related Art

An organic light-emitting device may be easily made to be thin, and has advantages such as wide viewing angles, fast response speeds, and low power consumption. Thus, organic light-emitting devices are highlighted as display devices of the next generation.

SUMMARY OF THE INVENTION

One or more aspects of the present invention provide organic light-emitting display devices and methods of manufacturing the same, which simplify manufacturing processes and improve device characteristics and aperture ratios.

According to an aspect of the present invention, there is provided a method of manufacturing an organic light-emitting display device, the method including a first mask operation including forming a semiconductor layer on a substrate, and forming an active layer of a TFT and a lower capacitor electrode by patterning the semiconductor layer; a second mask operation including forming a first insulating layer on the substrate so as to cover the active layer and the lower capacitor electrode, sequentially stacking a first conductive material on the first insulating layer, and a second conductive material with a different etching selectivity ratio from the first conductive material on the first insulating layer, forming a gate electrode including the first conductive material and the second conductive material, and forming an upper capacitor electrode including the first conductive material; a third mask operation including forming a second insulating layer on a resulting structure of the second mask operation, and forming contact holes exposing a portion of the active layer by patterning the second insulating layer; and a fourth mask operation including forming a third conductive material on a resulting structure of the third mask operation, forming source and drain electrodes by patterning the third conductive material, and forming a pixel electrode by extending one of the source and the drain electrode so as to include an entire portion where the upper capacitor electrode is formed.

The method may further include a fifth mask operation including forming a third insulating layer on a resulting structure of the fourth mask operation, and exposing the pixel electrode by the third insulating layer.

A light-emitting layer and an opposite electrode may be formed on the pixel electrode, after the fifth mask operation is performed.

The second mask operation may use a halftone mask.

The active layer and the lower capacitor electrode may be doped with ion impurities on the resulting structure of the second mask operation.

In the second mask operation, the second conductive material may include a low-resistance conductive material, and in the fourth mask operation, the pixel electrode may be formed so as to include a portion where the second gate electrode is formed.

In the fourth mask operation, the pixel electrode may be formed so as to be connected directly to the second insulating layer.

In the fourth mask operation, the third conductive material may include a first layer including Ti, a second layer comprising Ag or Al, and a third layer comprising any one selected from the group consisting of ITO, IZO, ZnO, and $In_2O_3$.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown.

Figure 1:
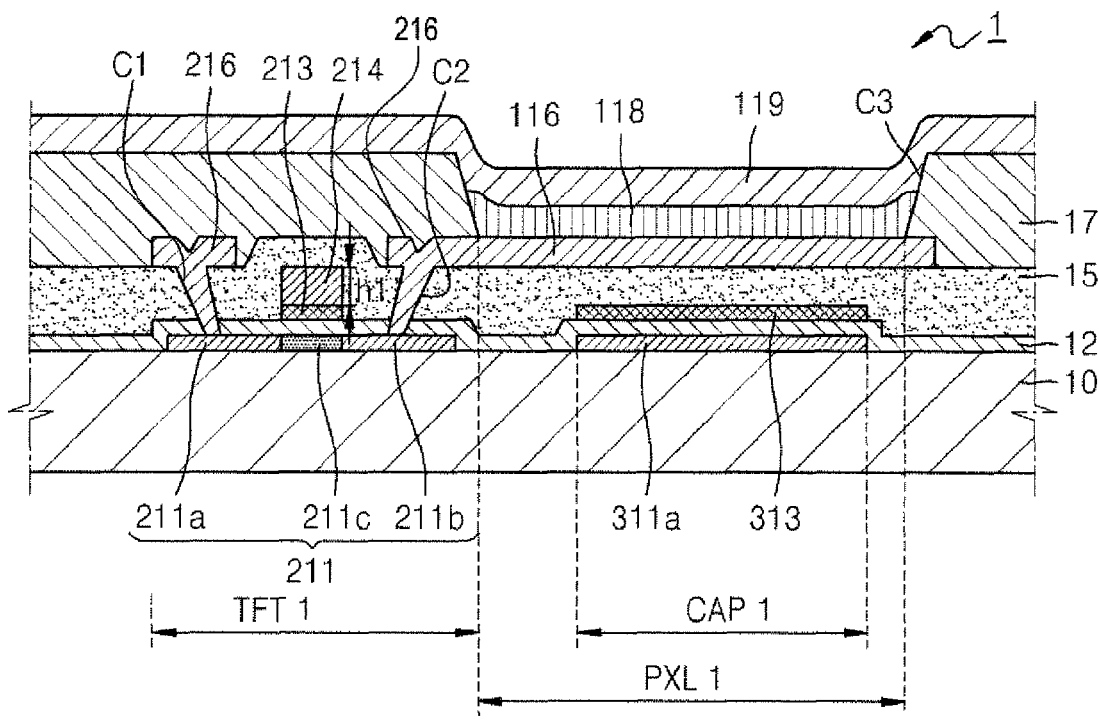
FIG. 1 is a cross-sectional view of an organic light-emitting display device according to an embodiment of the present invention.
Figure 2:
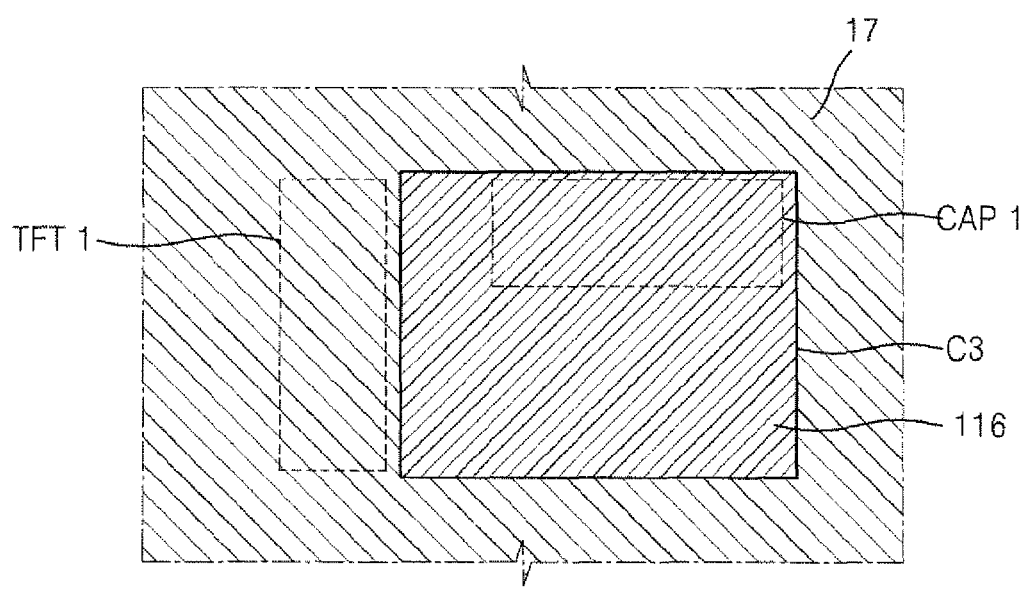
FIG. 2 is a plan view of the organic light-emitting display device to describe a positional relationship of a pixel electrode, a transistor region, and a capacitor region, according to an embodiment of the present invention.

FIG. 1 is a cross-sectional view of an organic light-emitting display device 1 according to an embodiment of the present invention. FIG. 2 is a plan view of the organic light-emitting display device 1 to describe a positional relationship of a pixel electrode 116, a transistor region TFT1 and a capacitor region CAP1, according to an embodiment of the present invention.

Referring to FIGS. 1 and 2, a pixel region PXL1 including a light-emitting layer 118, the transistor region TFT1 including a thin film transistor (TFT), and the capacitor region CAP1 including a capacitor are formed on a substrate 10 of the organic light-emitting display device 1.

In the transistor region TFT1, an active layer 211 of the TFT may be disposed on the substrate 10.

The substrate 10 may be formed of various materials such as a glass material, a plastic material, or a metal material.

Although not illustrated in FIGS. 1 and 2, a SiO$_2$ and/or SiN$_x$ buffer layer (not shown) may be formed on the substrate 10 in order to smooth the surface of the substrate 10 and to prevent impurities from penetrating into the substrate 10.

The active layer 211 may be formed of a semiconductor including amorphous silicon or polysilicon, and may include a channel region 211c, and source and drain regions 211a and 211b disposed outside the channel region 211c and doped with ion impurities. The source and drain regions 211a and 211b may be formed of a p-type semiconductor by doping a group III element, and may be formed of an n-type semiconductor by doping a group V element.

A first gate electrode 213 and a second gate electrode 214 may be sequentially stacked on the active layer 211 so as to correspond to the channel region 211c of the active layer 211, wherein a first insulating layer 12 as a gate insulating layer is disposed between the active layer 211 and the first gate electrode 213.

The first insulating layer 12 insulates the active layer 211, and the first gate electrode 213 from each other, and may be formed of an inorganic material such as SiNx and/or SiO$_2$.

The first and second gate electrodes 213 and 214 may include conductive materials with different etching selectivity ratios. For example, the first and second gate electrodes 213 and 214 may include conductive materials with different etching selectivity ratios which are selected from the group consisting of a transparent conductive material such as indium tin oxide (ITO), and titanium (Ti), molybdenum (Mo), aluminium (Al), silver (Ag), copper (Cu), and an alloy thereof. According to the present embodiment, the first gate electrode 213 is formed of ITO as a transparent conductive material, and the second gate electrode 214 is formed of Mo/Al/Mo as three layers with a thickness h1. The first gate electrode 213 may be formed of a transparent conductive material selected from the group consisting of indium zinc oxide (IZO), zinc oxide (ZnO) and In$_2$O$_3$, in addition to ITO.

Although not illustrated in FIGS. 1 and 2, the first and second gate electrodes 213 and 214 are connected to a gate line (not shown) for applying on/off signals to the TFT.

A second insulating layer 15, including contact holes C1 and C2, is disposed on the first and second gate electrodes 213 and 214. The second insulating layer 15 functions as an interlevel insulating layer for insulating the first and second gate electrodes 213 and 214, and source/drain electrodes 216 from each other, and also functions as a planarization layer formed directly below the pixel electrode 116, as will be described below.

The second insulating layer 15 may be formed of various insulating materials, for example, an insulating material such as oxide and nitride, and an organic material. An inorganic insulating layer for forming the second insulating layer 15 may include SiO$_2$, SiN$_x$, SiON, Al$_2$O$_3$, TiO$_2$, Ta$_2$O$_5$, HfO$_2$, ZrO$_2$, BST, PZT, or the like. An organic insulating layer for forming the second insulating layer 15 may include a general-use polymer (PMMA, PS), a polymer derivative having a phenol group, an acrylic polymer, an imide-based polymer, an aryl ether-based polymer, an amide-based polymer, a fluorine polymer, a p-xylene-based polymer, a vinyl alcohol-based polymer, and a blend of these. In addition, the second insulating layer 15 may be formed of a composite stack of organic insulation layers and inorganic insulation layers.

The source and drain electrodes 216 are connected to the source and drain regions 211a and 211b of the active layer 211 through the contact holes C1 and C2. In this case, one of the source and drain electrodes 216 may longitudinally extend on the second insulating layer 15 so as to function as the pixel electrode 116, and thus a process for forming a separate pixel electrode is not required, thereby simplifying a manufacturing process. In FIGS. 1 and 2, the source and drain electrodes 216 are illustrated as a single layer, but the present embodiment is not limited thereto. That is, the source and drain electrodes 216 may include a plurality of layers, as will be described below.

In the capacitor region CAP1, a lower capacitor electrode 311a. formed of the same material as that of the active layer 211 of the TFT, is disposed on the substrate 10. The lower capacitor electrode 311a may include a semiconductor doped with ion impurities that are the same materials as those of the source and drain regions 211a and 211b of the active layer 211 of the TFT. If the lower capacitor electrode 311a is formed of an intrinsic semiconductor that is not doped with ion impurities, the capacitor, together with an upper capacitor electrode 313, constitutes a metal oxide semiconductor (MOS) CAP structure. However, if the lower capacitor electrode 311a is formed of a semiconductor doped with ion impurities, the capacitor, together with the upper capacitor electrode 313, may constitute a metal-insulator-metal (MIM) CAP structure. The MIM CAP structure may maintain constant static capacity within a wide voltage range, compared to the MOS CAP structure, thereby increasing a voltage design margin during a circuit design.

Although described below, a process of doping the lower capacitor electrode 311a with ion impurities is simultaneously performed with a process of doping the source and drain regions 211a and 211b of the active layer 211 of the TFT with ion impurities. Thus, doping costs may be reduced by performing doping operations of high costs in a single process.

The first insulating layer 12, functioning as a gate insulating layer and a dielectric layer, is formed on the lower capacitor electrode 311a. and the upper capacitor electrode 313 is disposed on the first insulating layer 12.

The upper capacitor electrode 313 may be formed of the same material and on the same layer as the first gate electrode 213. In this case, the upper capacitor electrode 313 may be formed to be as thin as possible. The pixel electrode 116 may be formed directly on the second insulating layer 15 to have an entire portion where the upper capacitor electrode 313 is formed, thereby reducing a step difference of the second insulating layer 15 functioning as a planarization layer. Thus, a thickness of the upper capacitor electrode 313 may be 1000 Å or less.

The second insulating layer 15, functioning as a planarization layer, may be disposed on the first and second gate electrodes 213 and 214, and the upper capacitor electrode 313.

The pixel electrode 116, extending from one of the source and drain electrodes 216, is formed on the second insulating layer 15, and the pixel electrode 116 is formed so as to have an entire region where the upper capacitor electrode 313 is formed below the second insulating layer 15.

If the upper capacitor electrode 313 is thick, a step difference of a portion of the second insulating layer 15, which corresponds to an edge portion of the upper capacitor electrode 313, is increased due to the thickness of the upper capacitor electrode 313. In addition, the pixel electrode 116 and the light-emitting layer 118, which are formed on the second insulating layer 15 with the large step difference, are stepped, thereby causing problems such as dark spots. Thus, if the upper capacitor electrode 313 is thick, the pixel electrode 116 needs to be formed on a flat region except for the region where the upper capacitor electrode 313 is formed. In this case, since a range for forming the pixel electrode 116 may be reduced, an aperture ratio is reduced.

However, according to the present embodiment, in the organic light-emitting display device 1, the upper capacitor electrode 313 is formed to be thin, and thus a lower portion of the pixel electrode 116 may be planarized by using only the second insulating layer 15 without forming a separate planarization layer. As a result, the pixel electrode 116 may be formed directly on an upper portion of the second insulating layer 15 where the upper capacitor electrode 313 is formed, thereby increasing an aperture ratio.

In the pixel region PXL1, the pixel electrode 116, extending from one of the source and drain electrodes 216, is disposed on the second insulating layer 15. As described above, the pixel electrode 116 is formed of the same material and on the same layer as the source and drain electrodes 216. In this case, the pixel electrode 116 may function as a reflective electrode. In addition, the pixel electrode 116 may be formed so as to have an entire portion where the upper capacitor electrode 313 is formed.

A third insulating layer 17, including an opening C3 that exposes an upper portion of the pixel electrode 116 therethrough, is disposed on the second insulating layer 15. The third insulating layer 17 may be formed of an organic material or an inorganic material.

The light-emitting layer 118 is formed in the opening C3. The light-emitting layer 118 may be formed of a low-molecular weight organic material or a high-molecular weight organic material.

When the light-emitting layer 118 is a low-molecular weight organic layer, a hole transport layer (HTL), a hole injection layer (HIL), an electron transport layer (ETL), and an electron injection layer (EIL) may be stacked with respect to the light-emitting layer 118. If necessary, various layers may be stacked. Examples of available organic materials may include copper phthalocyanine (CuPc), N,N'-di(naphthalene-1-yl)-N,N'-diphenyl-benzidine (NPB), tris-8-hydroxyquinoline aluminum (Alq3), and the like.

When the light-emitting layer 118 is a high-molecular weight organic layer, a HTL may be stacked in addition to the light-emitting layer 118. The HTL may be formed of poly(ethylenedioxythiophene) (PEDOT), polyaniline (PANI), or the like. In this case, examples of available organic materials may include a high-molecular weight organic material such as polyphenylenevinylene, polyfluorene, or the like.

An opposite electrode 119 as a common electrode is disposed on the light-emitting layer 118. In the organic light-emitting display device 1, the pixel electrode 116 may function as an anode, and the opposite electrode 119 may function as a cathode, but polarities of the pixel electrode 116 and the opposite electrode 119 may be opposite to this.

According to the present embodiment, in the organic light-emitting display device 1, a method of forming a separate pixel electrode is not required, thereby simplifying a manufacturing process, and a metal-insulator-metal (MIM) CAP structure is formed, thereby increasing a voltage design margin during a circuit design. In addition, doping processes of high costs are simultaneously performed in a single operation, thereby reducing doping costs. Since the pixel electrode 116 may be formed directly on the second insulating layer 15 disposed on a region where the upper capacitor electrode 313 is formed, an aperture ratio is increased.

Hereinafter, a method of manufacturing the organic light-emitting display device 1 is described with reference to FIGS. 3 through 8.

Figure 3:
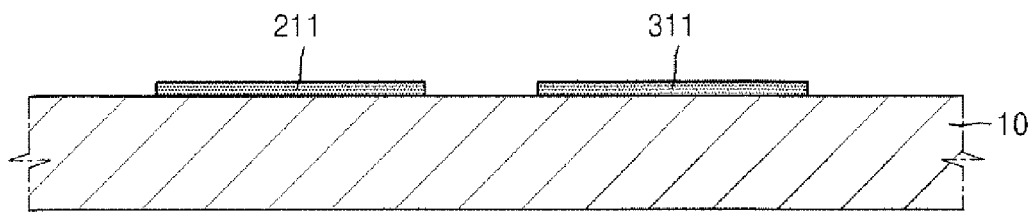
FIGS. 3 through 8 are cross-sectional views for describing a method of manufacturing an organic light-emitting display device, according to an embodiment of the present invention.

FIG. 3 is a cross-sectional view for describing a resultant of a first mask operation of the organic light-emitting display device 1, according to an embodiment of the present invention.

Referring to FIG. 3, the active layer 211 of the TFT, and an electrode 311 of a capacitor may be formed on the substrate 10.

Although not illustrated in FIG. 3, a semiconductor layer (not shown) is formed on the substrate 10, and a photoresist is coated on the semiconductor layer (not shown). The semiconductor layer (not shown) is patterned by using a photolithography method using a first photomask (not shown) so as to simultaneously form the active layer 211 of the TFT, and the electrode 311 of the capacitor.

The first mask operation by photolithography is performed by exposing the first photomask (not shown) by an exposure device (not shown) and then performing developing, etching, and stripping or ashing on the first photomask.

The semiconductor layer (not shown) may include amorphous silicon or polysilicon. In this case, polysilicon may be formed by crystallizing amorphous silicon. Amorphous silicon is crystallized by using various methods such as a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like.

Figure 4:
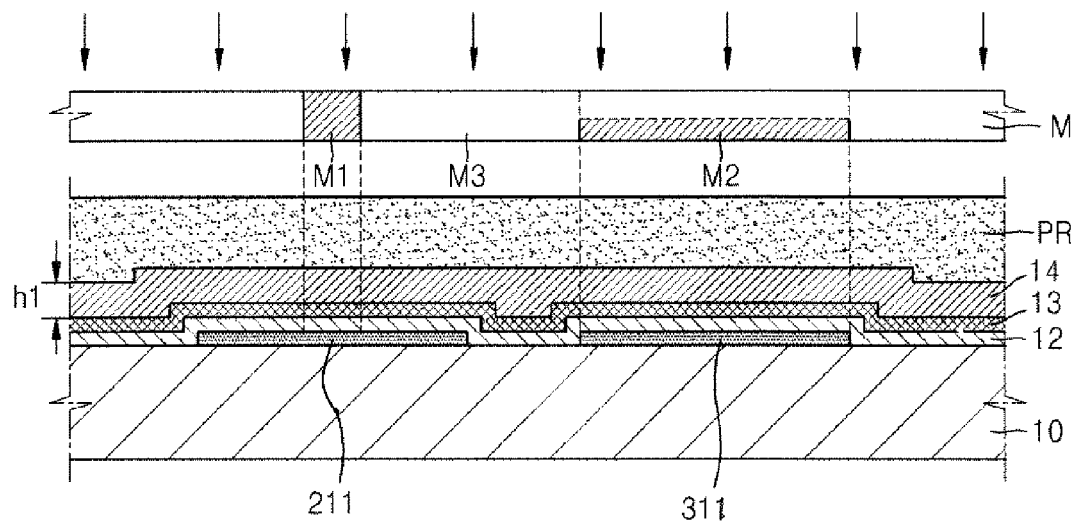

FIG. 4 is a cross-sectional view for describing a resultant of a second mask operation of the organic light-emitting display device 1, according to an embodiment of the present invention.

Referring to FIG. 4, the first insulating layer 12 is stacked on the resultant of the first mask operation of FIG. 3, a first conductive material 13 and a second conductive material 14 with a different etching selectivity ratio from the first conductive material 13 are sequentially stacked on the first insulating layer 12, and then a photoresist PR is coated on the second conductive material 14.

The second mask operation using a second photomask M is performed on the resulting structure. The second photomask M may be prepared as a halftone mask including a light-block portion M1, a semi-transmissive portion M2, and a transmissive portion M3.

The first conductive material 13 and the second conductive material 14 have different etching selectivity ratios. For example, first conductive material 13 and the second conductive material 14 may be selected from conductive materials with different etching selectivity ratios, which are selected from the group consisting of a transparent conductive material such as ITO, IZO, ZnO, and $In_2O_3$, and titanium (Ti), molybdenum (Mo), aluminium (Al), silver (Ag), copper (Cu), and an alloy thereof.

Figure 5:
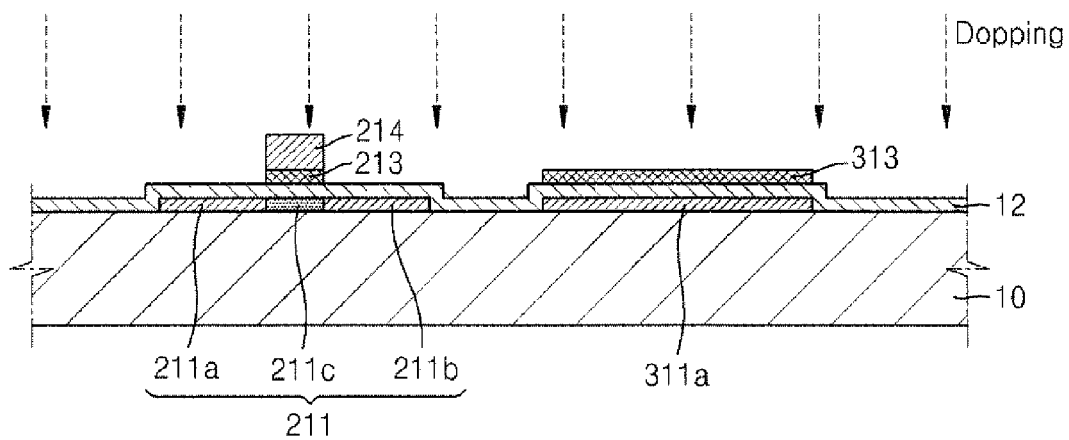

Referring to FIG. 5, as a result of the second photomask operation, the first conductive material 13 and the second conductive material 14 are patterned into the first and second gate electrodes 213 and 214 of the TFT, respectively, and simultaneously the first conductive material 13 is patterned into the upper capacitor electrode 313.

The above structure is doped with ion impurities. The ion impurities may be a group III or V element. The active layer 211 of the TFT, and the lower capacitor electrode 311 are doped with ion impurities having a concentration of $1 \times 10^{15}$ atoms/cm$^3$ or more.

In this case, the active layer 211 is doped with ion impurities by using the first and second gate electrodes 213 and 214 as a self-aligned mask, and thus the active layer 211 includes source and drain regions 212a and 212b doped with ion impurities, and a channel region 212c disposed between the source and drain regions 212a and 212b. That is, by using the first and second gate electrodes 213 and 214 as a self-aligned mask, without a separate photomask, the source and drain regions 212a and 212b may be formed.

As described above, since the upper capacitor electrode 313 is formed to have a small thickness of 1000 Å or less, ion impurities pass through the upper capacitor electrode 313 to dope the electrode 311 of the capacitor to form lower capacitor electrode 311a. As a result, the lower capacitor electrode 311a doped with ion impurities together with the upper capacitor electrode 313 constitutes a metal-insulator-metal (MIM) CAP structure, thereby increasing a voltage design margin during a circuit design. In addition, the active layer 211 and the lower capacitor electrode 311a may be simultaneously doped in a single doping operation, thereby reducing manufacturing costs.

Figure 6:
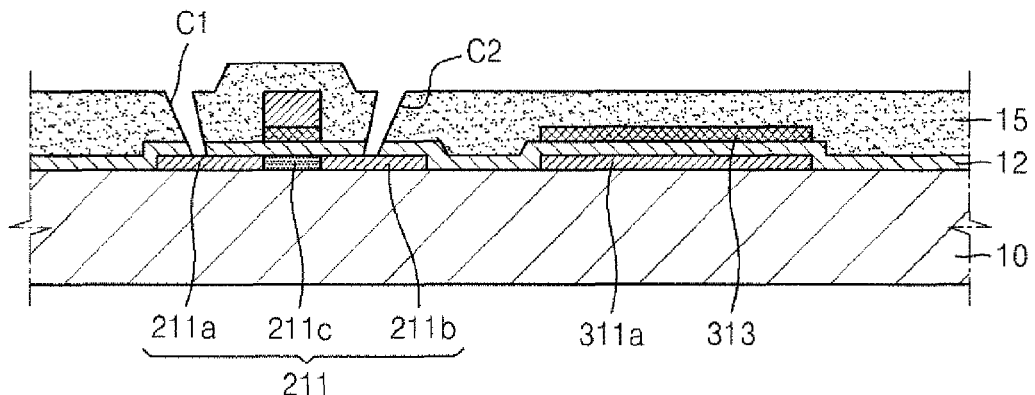

FIG. 6 is a cross-sectional view for describing a result of a third mask operation of the organic light-emitting display device 1, according to an embodiment of the present invention.

Referring to FIG. 6, the second insulating layer 15 is stacked on a resulting structure of the second mask operation of FIG. 5, and the contact holes C1 and C2 exposing portions of the source and drain regions 211a and 211b of the active layer 211 therethrough are formed by patterning the second insulating layer 15.

As described above, the second insulating layer 15 functions as an interlevel insulating layer for insulating the first and second gate electrodes 213 and 214 and the source and drain electrodes 216 from each other. In addition, the second insulating layer 15 may cover an upper portion of the upper capacitor electrode 313 having a small thickness so as to function as a planarization layer on which, as will be described below, the pixel electrode 116 if formed.

Figure 7:
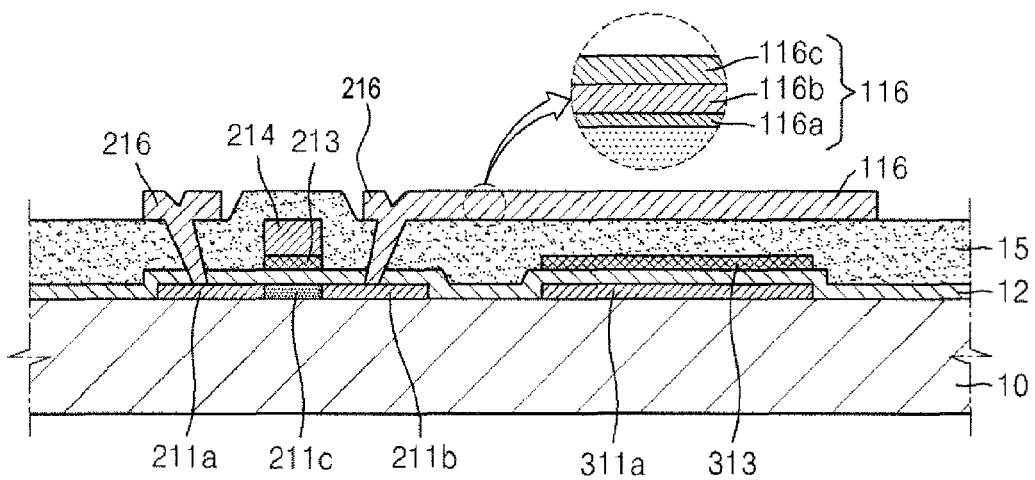

FIG. 7 is a cross-sectional view for describing a fourth mask operation of the organic light-emitting display device 1, according to an embodiment of the present invention.

Referring to FIG. 7, the source and drain electrodes 216 and the pixel electrode 116 extending from any one of the source and drain electrodes 216 are formed on a resulting structure of the third mask operation of FIG. 6. That is, the pixel electrode 116 is formed of the same material as the source and drain electrodes 216.

The source and drain electrodes 216 and the pixel electrode 116 may each include a single layer or a plurality of layers. As illustrated in FIG. 7, the source and drain electrodes 216 and the pixel electrode 116 include a first layer 116a, a second layer 116b, and a third layer 116c. The first layer 116a, as a planarization layer, may include Ti having excellent durability and electrical characteristics, and excellent adhesion with the second insulating layer 15. The second layer 116b may include Ag or Al so as to function as a reflective conductive layer. The third layer 116c may include any one selected from the group consisting of ITO, IZO, ZnO, and In$_2$O$_3$ so as to function as a transmissive conductive layer.

Figure 8:
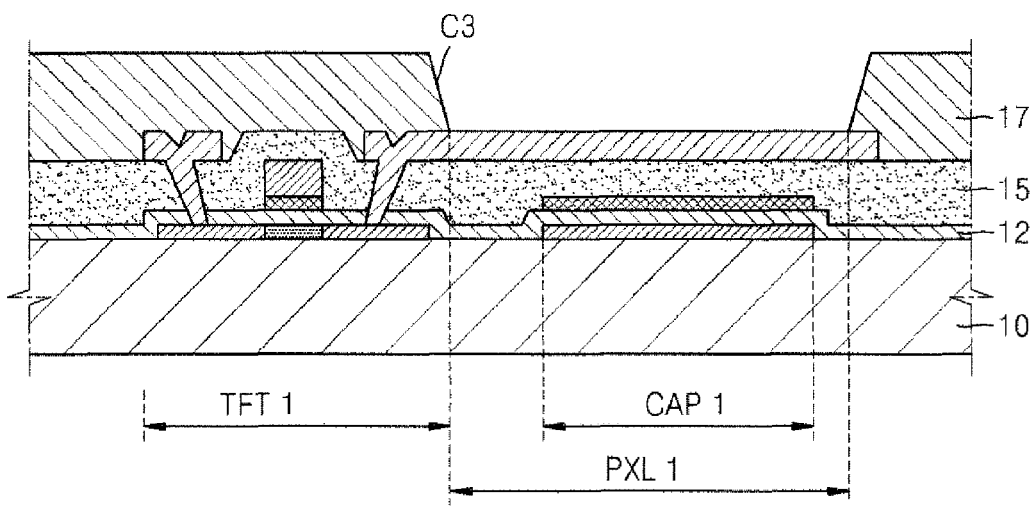

FIG. 8 is a cross-sectional view for describing a fifth mask operation of the organic light-emitting display device 1, according to an embodiment of the present invention.

Referring to FIG. 8, the third insulating layer 17 is formed on a resulting structure of the fourth mask operation of FIG. 7. In the fifth mask operation, the opening C3 exposing an upper surface of the pixel electrode 116 therethrough is formed in the third insulating layer 17. The light-emitting layer (118, see FIG. 1) is formed in the opening C3, and thus light is emitted from the light-emitting layer (118) by applying a voltage to the pixel electrode 116 and the opposite electrode (119, see FIG. 1). Thus, a light-emitting region is enlarged, thereby increasing an aperture ratio.

Hereinafter, an organic light-emitting display device 2 is described with reference to FIGS. 9 and 10.

Figure 9:
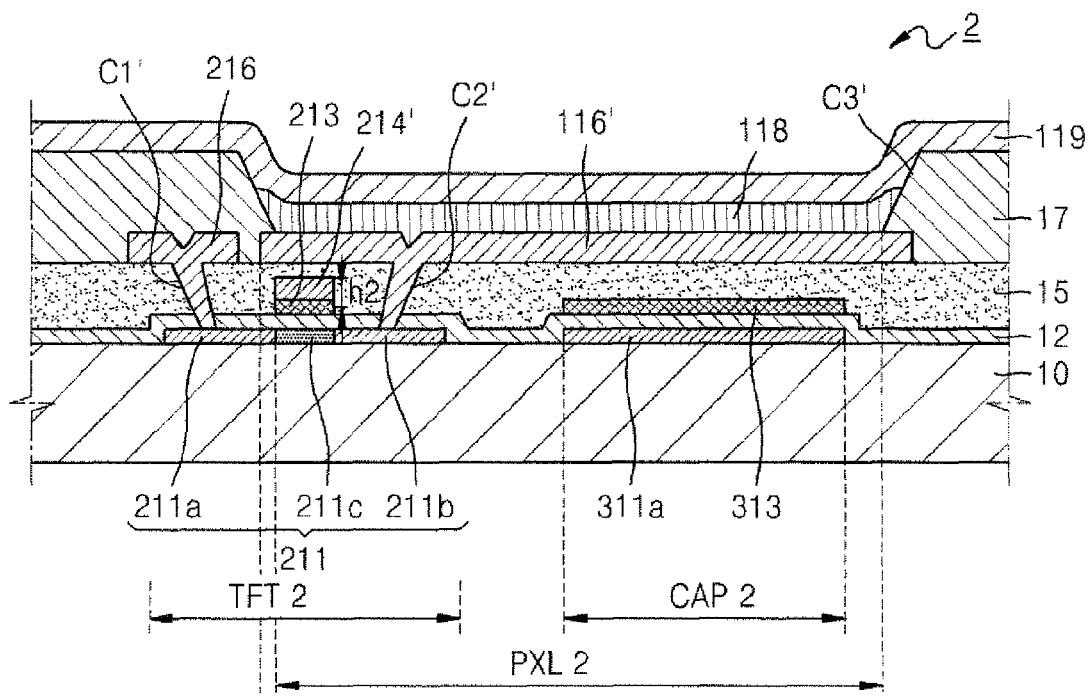
FIG. 9 is a cross-sectional view of the organic light-emitting display device according to another embodiment of the present invention.

FIG. 9 is a cross-sectional view of the organic light-emitting display device 2 according to another embodiment of the present invention. FIG. 10 is a plan view of the organic light-emitting display device 2 to describe a positional relationship of a pixel electrode 116', a transistor region TFT2, and a capacitor region CAP2, according to an embodiment of the present invention. In FIGS. 1 and 10, like reference numerals in the drawings denote like elements, and thus the organic light-emitting display device 2 will be described in terms of differences from the above-described embodiment of FIG. 1.

Figure 10:
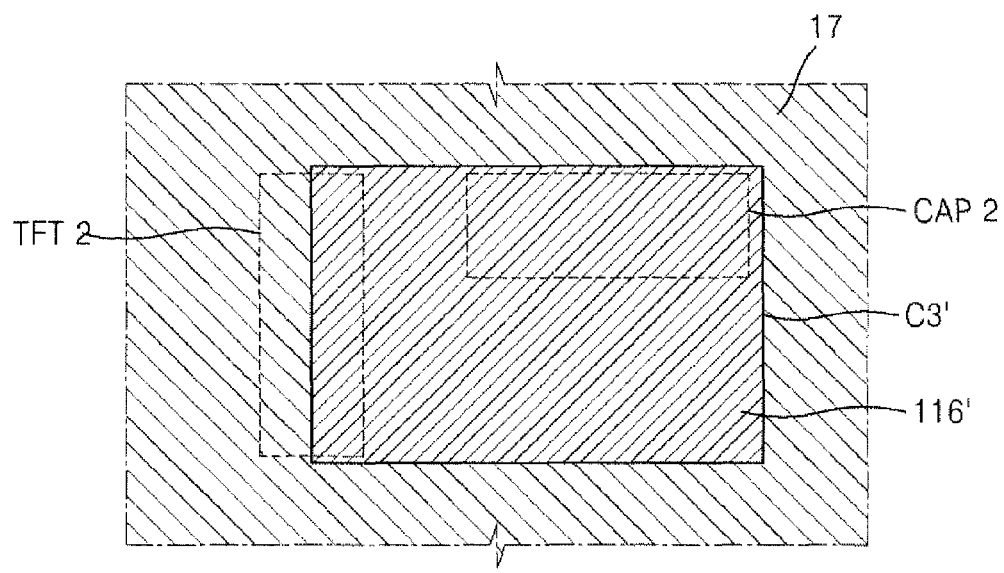
FIG. 10 is a plan view of the organic light-emitting display device to describe a positional relationship of a pixel electrode, a transistor region, and a capacitor region, according to another embodiment of the present invention.

Referring to FIGS. 9 and 10, the organic light-emitting display device 2 includes a pixel region PXL2 including the light-emitting layer 118, the transistor region TFT2 including a thin film transistor (TFT), and the capacitor region CAP2 including a capacitor, which are formed on the substrate 10.

The active layer 211 including the channel region 211c, and the source and drain regions 211a and 211b of the TFT is formed in the transistor region TFT2 on the substrate 10. The first insulating layer 12 is formed on the active layer 211. First and second gate electrodes 213 and 214' are sequentially formed so as to correspond to the channel region 211c. The source and drain regions 211a and 211b are doped with ion impurities.

The first and second gate electrodes 213 and 214' are formed of conductive materials with different etching selectivity ratios. According to the present embodiment, the second gate electrode 214' is formed of a low-resistance conductive material. For example, the second gate electrode 214' may be formed of Cu. Since the second gate electrode 214' is formed of a low-resistance conductive material, a wiring (for example, a gate line (not shown)) connected to the second gate electrode 214', and the second gate electrode 214' may be formed to have a thickness h2 that is smaller than the thickness h1 of the second gate electrode 214, described with reference to FIGS. 1 and 2. Thus, a step difference of the second insulating layer 15 formed on the wiring connected to the second gate electrode 214 or the second gate electrode 214' may be minimized. By minimizing the step difference of the second insulating layer 15 functioning as a planarization layer, the pixel electrode 116' may be enlarged to upper portions of the first and second gate electrodes 213 and 214', as described below.

The second insulating layer 15, including contact holes C1' and C2', is formed on the first and second gate electrodes 213 and 214'. The second insulating layer 15 functions as an interlevel insulating layer for insulating the first and second gate electrodes 213 and 214' and the source and drain electrodes 216 from each other, and functions as a planarization layer formed directly below the pixel electrode 116'.

The source and drain electrodes 216 are connected to the source and drain regions 211a and 211b of the active layer 211 through the contact holes C1' and C2'. In this case, one of the source and drain electrodes 216 may longitudinally extend on the second insulating layer 15 so as to function as pixel electrode 116', and thus a process for forming a separate pixel electrode is not required, thereby simplifying manufacturing processes.

The lower capacitor electrode 311a doped with ion impurities is formed in the capacitor region CAP2 on the substrate 10, like the source and drain regions 211a and 211b of the active layer 211 of the TFT. The first insulating layer 12, functioning as a dielectric layer as well as a gate insulating layer, is formed on the lower capacitor electrode 311a. The upper capacitor electrode 313 is formed on the first insulating layer 12. The upper capacitor electrode 313 is formed of the same material and on the same layer as the first gate electrode 213. In this case, the upper capacitor electrode 313 may be formed to be as thin as possible. As described above, the pixel electrode 116' is formed directly on the second insulating layer 15 so as to have an entire portion where the upper capacitor electrode 313 is formed, and a step difference of the second insulating layer 15 functioning as a planarization layer. Thus, a thickness of the upper capacitor electrode 313 may be 1000 Å or less.

The second insulating layer 15, functioning as a planarization layer, is formed on the first and second gate electrodes 213 and 214' and the upper capacitor electrode 313.

The pixel electrode 116', extending from one of the source and drain electrodes 216, is formed on the second insulating layer 15, and the pixel electrode 116' is formed so as to cover an upper portion of the first and second gate electrodes 213 and 214' of the TFT as well as the upper capacitor electrode 313 formed below the second insulating layer 15.

According to the present embodiment, since the second gate electrode 214' of the transistor region TFT2, as well as the upper capacitor electrode 313, is formed of a low-resistance conductive material so as to have a small thickness, the pixel electrode 116' may be formed so as to cover an upper portion of the first and second gate electrodes 213 and 214' as well as the upper capacitor electrode 313, thereby further increasing an aperture ratio.

As described above, an organic light-emitting display apparatus, and a method of manufacturing the same may provide the following effects.

First, a process for forming a separate pixel electrode is not required, thereby simplifying manufacturing processes.

Second, a voltage design margin may be increased during a circuit design due to forming a MIM CAP structure.

Third, doping costs may be reduced by performing doping operations of high costs in a single process.

Fourth, a pixel electrode is formed on a portion where a capacitor is formed, thereby increasing an aperture ratio.

Fifth, since a separate planarization layer is not required, manufacturing processes may be simplified and a thin display device may be obtained.

Sixth, the above-described organic light-emitting display device may be manufactured by using five mask operations.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display device, the method comprising:
 a first mask operation comprising forming a semiconductor layer on a substrate, and forming an active layer of a thin film transistor and a lower capacitor electrode by patterning the semiconductor layer;
 a second mask operation comprising forming a first insulating layer on the substrate so as to cover the active layer and the lower capacitor electrode, sequentially stacking a first conductive material on the first insulating layer, and a second conductive material with a different etching selectivity ratio from the first conductive material on the first insulating layer, forming, by patterning, a gate electrode comprising the first conductive material and the second conductive material, and forming, by patterning, an upper capacitor electrode comprising the first conductive material;
 a third mask operation comprising forming a second insulating layer on a resulting structure of the second mask operation, and forming contact holes exposing a portion of the active layer by patterning the second insulating layer; and
 a fourth mask operation comprising forming a third conductive material on a resulting structure of the third mask operation, forming source and drain electrodes by patterning the third conductive material, and forming a pixel electrode by extending one of the source and the drain electrode so as to cover an area comprised of an entire portion where the upper capacitor electrode is formed.

2. The method of claim 1, further comprising a fifth mask operation comprising forming a third insulating layer on a resulting structure of the fourth mask operation, and exposing the pixel electrode by patterning the third insulating layer.

3. The method of claim 2, wherein a light-emitting layer and an opposite electrode are formed on the exposed pixel electrode, after the fifth mask operation is performed.

4. The method of claim 1, wherein the second mask operation uses a halftone mask.

5. The method of claim 1, wherein the active layer and the lower capacitor electrode are doped with ion impurities on the resulting structure of the second mask operation.

6. The method of claim 1, wherein, in the second mask operation, the second conductive material comprises a low-resistance conductive material, and
 wherein, in the fourth mask operation, the pixel electrode is formed so as to further cover an area where the gate electrode is formed.

7. The method of claim 1, wherein, in the fourth mask operation, the third conductive material comprises a first layer comprising titanium (Ti), a second layer comprising silver (Ag) or aluminum (Al), and a third layer comprising any one selected from the group consisting of ITO, IZO, ZnO, and $In_2O_3$.

* * * * *